(12) United States Patent
Wu (10) Patent No.: US 11,811,403 B2
(45) Date of Patent: Nov. 7, 2023

(54) CLOCK COUNTER, METHOD FOR CLOCK COUNTING, AND STORAGE APPARATUS

(71) Applicant: CHANGXIN MEMORY TECHNOLOGIES, INC., Hefei (CN)

(72) Inventor: Zengquan Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/888,516

(22) Filed: Aug. 16, 2022

(65) Prior Publication Data

US 2022/0393687 A1 Dec. 8, 2022

Related U.S. Application Data

(63) Continuation of application No. PCT/CN2022/086500, filed on Apr. 13, 2022.

(30) Foreign Application Priority Data

Mar. 25, 2022 (CN) .......................... 202210299683.X (51) Int. Cl.
*H03K 21/02* (2006.01)
*H03K 21/10* (2006.01)
(Continued)

(52) U.S. Cl.
CPC ............. *H03K 21/10* (2013.01); *H03K 3/037* (2013.01); *H03K 19/20* (2013.01); *H03K 21/026* (2013.01)

(58) Field of Classification Search
CPC ........ H03K 3/037; H03K 19/20; H03K 21/02; H03K 21/026; H03K 21/08; H03K 21/10;
(Continued)

(56) References Cited

U.S. PATENT DOCUMENTS 5,267,273 A 11/1993 Dartois et al.
6,026,141 A * 2/2000 Lo .......................... H03K 23/40
377/114
(Continued)

FOREIGN PATENT DOCUMENTS

CN 201608704 U 10/2010
CN 101964662 A 2/2011
(Continued)

OTHER PUBLICATIONS

Taiwan Patent Office, Office Action Issued in related Application No. 111134483, dated Jul. 21, 2023, 6 pages.

*Primary Examiner* — Long Nguyen
(74) *Attorney, Agent, or Firm* — KILPATRICK TOWNSEND & STOCKTON LLP (57) ABSTRACT

Embodiments relate to a clock counter, a method for clock counting, and a storage apparatus. The clock counter includes a clock frequency-dividing circuit, a plurality of counting circuits, and an adding circuit. The clock frequency-dividing circuit receives a clock signal and divide a frequency of the clock signal to output a plurality of frequency-divided clock signals, sum of number of pulses of the plurality of frequency-divided clock signals being equal to number of pulses of the clock signal. The plurality of counting circuits are connected to the clock frequency-dividing circuit, each of the plurality of counting circuits being configured to respectively count pulses for each of the plurality of frequency-divided clock signals and generate an initial count value. The adding circuit is connected to the plurality of counting circuits, and adds up the initial count values of the plurality of counting circuits to generate a target count value.

15 Claims, 8 Drawing Sheets (51) Int. Cl.
*H03K 3/037* (2006.01)
*H03K 19/20* (2006.01)

(58) Field of Classification Search
CPC .. H03K 23/58; G06F 1/04; G06F 1/06; G06F 1/08; G06F 1/10
See application file for complete search history.

(56) References Cited

U.S. PATENT DOCUMENTS 10,361,709 B2     7/2019   Lesso
11,493,950 B2 *   11/2022   Fredenburg ............... G06F 1/10

FOREIGN PATENT DOCUMENTS

| CN | 107994896 | A | 5/2018 |
|---|---|---|---|
| CN | 110868212 | A | 3/2020 |
| CN | 111066085 | A | 4/2020 |
| CN | 112965356 | A | 6/2021 |
| CN | 213715796 | U | 7/2021 |
| TW | I642277 | B | 11/2018 |

* cited by examiner

CLOCK COUNTER, METHOD FOR CLOCK COUNTING, AND STORAGE APPARATUS

CROSS-REFERENCE TO RELATED APPLICATION

The present disclosure is a continuation of PCT/CN2022/086500, filed on Apr. 13, 2022, which claims priority to Chinese Patent Application No. 202210299683.X titled "CLOCK COUNTER, METHOD FOR CLOCK COUNTING, AND STORAGE APPARATUS" and filed to the State Patent Intellectual Property Office on Mar. 25, 2022, the entire contents of which are incorporated herein by reference.

TECHNICAL FIELD

Embodiments of the present disclosure relate to the field of integrated circuit, and more particularly, to a clock counter, a method for clock counting, and a storage apparatus.

BACKGROUND

Control chips such as central processing units or microprocessors generally are provided with system clock generators, which can generate a series of original high-frequency pulse waves. These original high-frequency pulse waves are inputted into clock generator chips for pulse shaping and frequency dividing, and then are distributed to various frequencies required for different functional circuits inside the control chips.

However, when designing a high-frequency clock counter whose operating frequency is higher than 1 Ghz, due to speed limitation on a device itself, carry operation delay time of the counter may be greater than a count clock period of the counter, which may result in counting errors, such that performance and reliability of functional circuits using this high-frequency clock counter are reduced, and operating speed of the control chips using this high-frequency clock counter is limited.

SUMMARY

According to various embodiments of the present disclosure, a clock counter, a method for clock counting and a storage apparatus are provided.

According to some embodiments, one aspect of the present disclosure provides a clock counter, which includes a clock frequency-dividing circuit, a plurality of counting circuits, and an adding circuit. The clock frequency-dividing circuit is configured to receive a clock signal and divide a frequency of the clock signal to output a plurality of frequency-divided clock signals, sum of number of pulses of the plurality of frequency-divided clock signals being equal to number of pulses of the clock signal. The plurality of counting circuits are connected to the clock frequency-dividing circuit, and each of the plurality of counting circuits is configured to respectively count pulses for each of the plurality of frequency-divided clock signals and generate an initial count value. The adding circuit is connected to the plurality of counting circuits, and is configured to add up the initial count values of the plurality of counting circuits to generate a target count value.

According to some embodiments, the frequency of the clock signal is an integral multiple of frequencies of the plurality of frequency-divided clock signals.

According to some embodiments, the clock frequency-dividing circuit includes: a clock frequency-dividing subcircuit and a logic subcircuit. The clock frequency-dividing subcircuit is connected to the clock signal, and is configured to generate at least one initial frequency-divided clock signal according to the clock signal. The logic subcircuit is connected to both an output terminal of the clock frequency-dividing subcircuit and the clock signal, and the logic subcircuit is configured to generate the plurality of frequency-divided clock signals according to the at least one initial frequency-divided clock signal and the clock signal.

According to some embodiments, the plurality of frequency-divided clock signals include a first divide-by-two clock signal and a second divide-by-two clock signal. The logic subcircuit includes a first AND gate, a second AND gate, and a first inverter. A first input terminal of the first AND gate is connected to the clock signal, a second input terminal of the first AND gate is connected to the output terminal of the clock frequency-dividing subcircuit, and an output terminal of the first AND gate is configured to output the first divide-by-two clock signal. An input terminal of the first inverter is connected to the output terminal of the clock frequency-dividing subcircuit, and an output terminal of the first inverter is connected to a second input terminal of the second AND gate. A first input terminal of the second AND gate is connected to the clock signal, and an output terminal of the second AND gate is configured to output the second divide-by-two clock signal.

According to some embodiments, the clock frequency-dividing subcircuit includes a second inverter and a first D flip-flop. A clock input terminal of the first D flip-flop is configured to receive the clock signal, a data input terminal of the first D flip-flop is connected to an output terminal of the second inverter, a data output terminal of the first D flip-flop is connected to an input terminal of the second inverter, and an output terminal of the first D flip-flop is configured to output the at least one initial frequency-divided clock signal.

According to some embodiments, the plurality of frequency-divided clock signals have an equal frequency.

According to some embodiments, pulses of some of the plurality of frequency-divided clock signals different are misaligned with each other.

According to some embodiments, each of the plurality of counting circuits includes N second D flip-flops denoted in sequence as a second $D_1$ flip-flop, . . . , a second $D_i$ flip-flop, . . . , and a second $D_N$ flip-flop, and N half adders corresponding to the N second D flip-flops, where the N half adders are denoted in sequence as a first half adder, . . . , an $i^{th}$ half adder, . . . , and an $N^{th}$ half adder, $1 \le i \le N$, both i and N being positive integers. The frequency-divided clock signals received by clock input terminals of the second D flip-flops in the same counting circuit are the same, and the frequency-divided clock signals received by the clock input terminals of the second D flip-flops in the different counting circuits are different. An output terminal of the second $D_i$ flip-flop is connected to a second input terminal of the $i^{th}$ half adder, a data input terminal of the second $D_i$ flip-flop is connected to a sum value output terminal of the $i^{th}$ half adder, and a first input terminal of the $i^{th}$ half adder is connected to a carry terminal of the $(i-1)^{th}$ half adder, where a first input terminal of the first half adder is configured to receive a reset signal. Values from the output terminals of the N second D flip-flops constitute one of the initial count values.

According to some embodiments, the adding circuit includes a multi-input adder configured to add up the initial count values of the plurality of counting circuits to generate the target count value.

According to some embodiments, the clock counter includes two of the plurality of counting circuits, and the adding circuit includes N+1 full adders denoted in sequence as a first full adder, ..., an $i^{th}$ full adder, ..., and an $(N+1)^{th}$ full adder. A first input terminal of the $i^{th}$ full adder is connected to the output terminal of the second $D_i$ flip-flop in one of the plurality of counting circuits, a second input terminal of the $i^{th}$ full adder is connected to the output terminal of the second $D_i$ flip-flop in another one of the plurality of counting circuits, and an input carry terminal of the $i^{th}$ full adder is connected to an output carry terminal of the $(i-1)^{th}$ full adder. An input carry terminal of the first full adder is grounded, a first input terminal and a second input terminal of the $(N+1)^{th}$ full adder are grounded, and an input carry terminal of the $(N+1)^{th}$ full adder is connected to an output carry terminal of the $N^{th}$ full adder. Values from sum value output terminals of the N+1 full adders constitute the target count value, $2 \leq i \leq N$, both I and N being positive integers.

According to some embodiments, another aspect of the present disclosure provides a method for clock counting, which includes: receiving a clock signal and dividing a frequency of the clock signal to generate a plurality of frequency-divided clock signals, sum of number of pulses of the plurality of frequency-divided clock signals being equal to number of pulses of the clock signal; respectively counting pulses for the plurality of frequency-divided clock signals to obtain a plurality of initial count values; and adding up the plurality of initial count values to obtain a target count value.

According to some embodiments, the frequency of the clock signal is an integral multiple of frequencies of the plurality of frequency-divided clock signals, where the frequencies of the plurality of frequency-divided clock signals are equal.

According to some embodiments, pulses of some of the plurality of frequency-divided clock signals different are misaligned with each other.

According to some embodiments, number of the plurality of frequency-divided clock signals is two.

According to some embodiments, yet another aspect of the present disclosure provides a storage apparatus, which includes a clock counter in any one of the embodiments of the present disclosure.

The embodiments of the present disclosure may at least have following advantages.

In the clock counter, the method for clock counting and the storage apparatus provided by the embodiments of the present disclosure, a clock frequency-dividing circuit is employed to divide a frequency of a clock signal to output a plurality of frequency-divided clock signals. Next, the plurality of frequency-divided clock signals whose frequencies are reduced are separately counted by means of a plurality of counting circuits, which can effectively reduce carry operation delay time for the plurality of counting circuits compared to directly counting the clock signal. Next, a plurality of initial count values outputted from the plurality of counting circuits are added up by means of an adding circuit to generate a target count value, thereby preventing occurrence of counting errors caused by the carry operation delay time exceeding a count clock period. In this way, an operating frequency of the counter is increased, and thus performance and reliability of functional circuits in the clock counter provided by the embodiments of the present disclosure are improved, which is advantageous to increasing an operating speed of a control chip for the clock counter provided by the embodiments of the present disclosure.

In addition, in the embodiments of the present disclosure, the plurality of frequency-divided clock signals are obtained by dividing the frequency of the clock signal by means of the clock frequency-dividing circuit. Therefore, the clock frequency-dividing circuit may be set as a divide-by-two circuit, a divide-by-three circuit or a divide-by-four circuit and so on based on different application scenarios, and correspondingly, the frequency of the clock signal is divided into a divide-by-two signal, a divide-by-three signal or a divide-by-four and so on, to meet different requirements for the clock frequency in different application scenarios. The frequency of the clock signal is divided into at least one initial frequency-divided clock signal by means of the clock frequency-dividing subcircuit. Next, a plurality of frequency-divided clock signals, whose periods are an integral multiple of the period of the clock signal, are generated by means of the logic subcircuit based on a logical relationship between the at least one initial frequency-divided clock signal and the clock signal, such that rising edges or falling edges of the plurality of frequency-divided clock signals are respectively counted subsequently, and a sum value of all the counts is determined as a measurement value for number of pulses in the clock signal. Compared with directly counting number of pulses in the clock signal, the respectively counting the rising edges or falling edges of the first divide-by-two clock signal and the second divide-by-two clock signal and determining a sum value of the two counts as a measurement value for number of pulses in the clock signal can effectively reduce the carry operation delay time for the plurality of counting circuits and prevent occurrence of counting errors caused by the carry operation delay time exceeding the count clock period, such that the operating frequency, stability and reliability of the counter are improved.

In conclusion, the clock counter, the method for clock counting and the storage apparatus provided by the embodiments of the present disclosure can effectively reduce the carry operation delay time of a high-frequency clock counter, can prevent occurrence of counting errors caused by the carry operation delay time exceeding the count clock period, and can increase the operating frequency of the clock counter.

Details of one or more embodiments of the present disclosure are set forth in the following drawings and descriptions. Other features, objectives, and advantages of the present disclosure will become apparent from the description, the drawings, and the claims.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

For ease of understanding the embodiments of the present disclosure, the embodiments of the present disclosure will be described more fully hereinafter with reference to the accompanying drawings. Some embodiments among the embodiments of the present disclosure are provided in the accompanying drawings. However, the embodiments of the present disclosure may be embodied in many different forms and should not be limited to the embodiments set forth herein. Rather, these embodiments are provided such that disclosed contents of the embodiments of the present disclosure will be more thorough and complete.

Unless otherwise defined, all technical and scientific terms employed herein have the same meaning as commonly understood by those skilled in the art to which the embodiments of the present disclosure belong. The terms employed in the specification of the embodiments of the present disclosure are merely for the purpose of describing some embodiments and are not intended for limiting the embodiments of the present disclosure.

In addition, certain terms used throughout the specification and the following claims refer to particular components. Those skilled in the art will understand that manufacturers may represent components with different names. This document does not intend to distinguish between components with different names but the same functions. In the following description and embodiments, the terms "including" and "comprising" are used in an open-ended fashion, and thus should be interpreted as "including, but not limited to . . . ". Likewise, the term "connection" is intended to express an indirect or direct electrical connection. Correspondingly, if one device is connected to another device, the connection between the two devices may be achieved by means of a direct electrical connection, or by means of an indirect electrical connection of other devices and connectors.

It should be understood that although terms such as "first", "second" and the like may be used herein to describe various components, these components should not be limited by these terms. These terms are only intended to distinguish one component from another one. For example, a first component may be termed a second component, and similarly, a second component may be termed a first component, without departing from the scope of the embodiments of the present disclosure.

Figure 1:
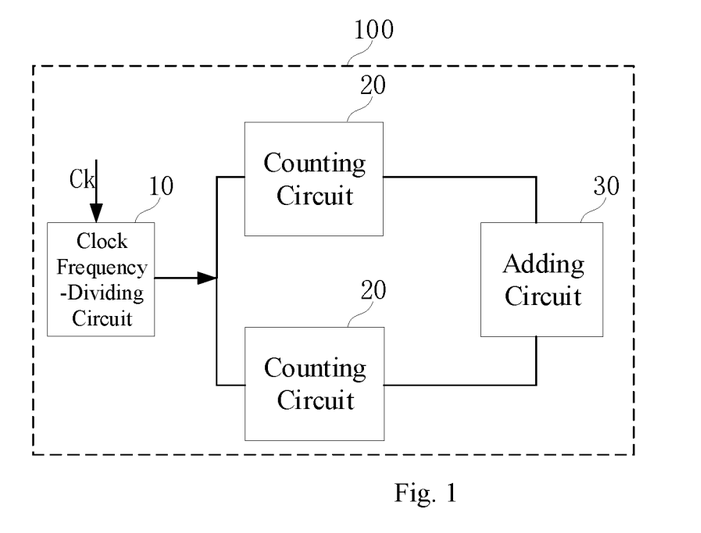
FIG. 1 is a schematic diagram showing a circuit principle of a clock counter according to an embodiment of the present disclosure.

Referring to FIG. 1, in some embodiments of the present disclosure, there is provided a clock counter 100, which includes a clock frequency-dividing circuit 10, a plurality of counting circuits 20, and an adding circuit 30. The clock frequency-dividing circuit 10 is configured to receive a clock signal Ck and divide a frequency of the clock signal Ck to output a plurality of frequency-divided clock signals, where sum of number of pulses of the plurality of frequency-divided clock signals is equal to number of pulses of the clock signal Ck. The plurality of counting circuits 20 are connected to the clock frequency-dividing circuit 10, and each of the plurality of counting circuits 20 is configured to respectively count pulses for each of the plurality of frequency-divided clock signals and generate an initial count value. The adding circuit 30 is connected to the plurality of counting circuits, and is configured to add up the initial count values of the plurality of counting circuits 20 to generate a target count value.

Figure 2:
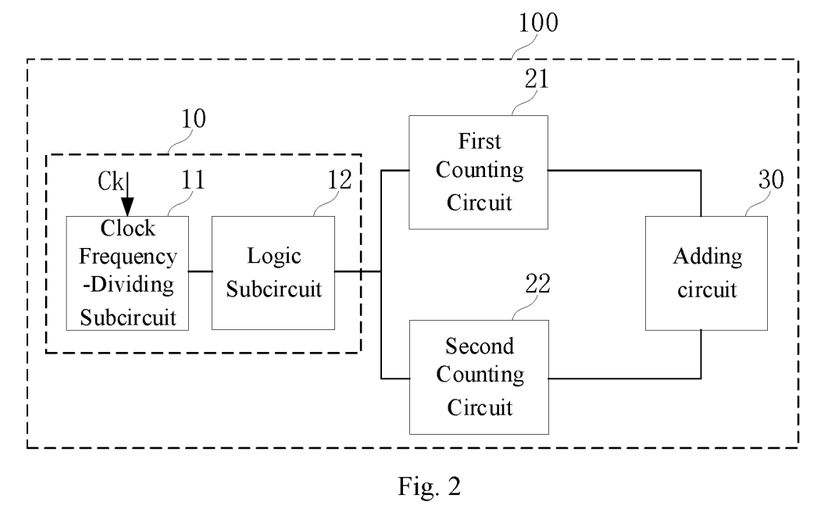
FIG. 2 is a schematic diagram showing a circuit principle of a clock counter according to another embodiment of the present disclosure.

As an example, referring to FIG. 2, the clock counter 100 may include a clock frequency-dividing circuit 10, a first counting circuit 21, a second counting circuit 22, and an adding circuit 30. First, the clock frequency-dividing circuit 10 is employed to divide the frequency of the clock signal Ck to output two frequency-divided clock signals. Next, the plurality of frequency-divided clock signals whose frequencies are reduced are separately counted by means of the first counting circuit 21 and the second counting circuit 22, which can effectively reduce carry operation delay time of the two counting circuits compared to directly counting the clock signal Ck. Next, initial count values outputted from the first counting circuit 21 and the second counting circuit 22 are added up by means of the adding circuit 30 to generate a target count value, thereby preventing occurrence of counting errors caused by the carry operation delay time exceeding a count clock period. In this way, an operating frequency of the counter is increased, and thus performance and reliability of functional circuits in the clock counter 100 provided by the embodiments of the present disclosure are improved, which is advantageous to increasing an operating speed of a control chip for the clock counter 100 provided by the embodiments of the present disclosure.

As an example, with continued reference to FIG. 2, the frequency of the clock signal Ck is an integral multiple of frequencies of the plurality of frequency-divided clock signals. The plurality of frequency-divided clock signals are obtained by dividing the frequency of the clock signal Ck by means of the clock frequency-dividing circuit 10. Therefore, the clock frequency-dividing circuit 10 may be set as a divide-by-two circuit, a divide-by-three circuit or a divide-by-four circuit and so on based on different application scenarios, and correspondingly, the frequency of the clock signal Ck is divided into a divide-by-two signal, a divide-by-three signal or a divide-by-four and so on, to meet different requirements for the clock frequency in different application scenarios.

Figure 3A:
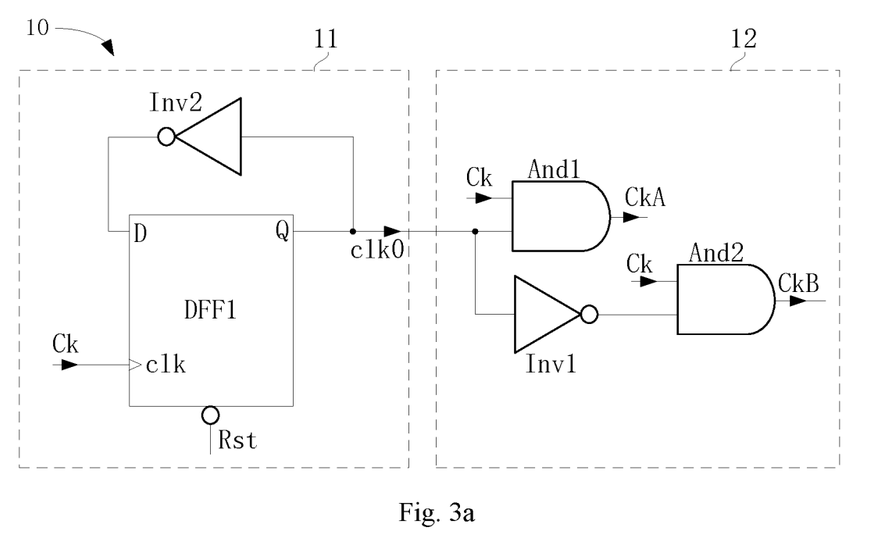
FIGS. 3a-3c are schematic circuit diagrams of clock frequency-dividing circuits in the clock counter according to different embodiments of the present disclosure.

As an example, referring to FIG. 3A, the clock frequency-dividing circuit 10 includes a clock frequency-dividing subcircuit 11 and a logic subcircuit 12. The clock frequency-dividing subcircuit 11 is connected to the clock signal Ck, and is configured to generate at least one initial frequency-divided clock signal clk0 according to the clock signal Ck. The logic subcircuit 12 is connected to both an output terminal of the clock frequency-dividing subcircuit 11 and the clock signal Ck, and the logic subcircuit 12 is configured to generate the plurality of frequency-divided clock signals according to the at least one initial frequency-divided clock signal clk0 and the clock signal Ck. The frequency of the clock signal Ck is divided into at least one initial frequency-divided clock signal clk0 by means of the clock frequency-dividing subcircuit 11, and then a plurality of frequency-divided clock signals, whose periods are an integral multiple of the period of the clock signal Ck, are generated by means of the logic subcircuit 12 based on a logical relationship between the at least one initial frequency-divided clock signal clk0 and the clock signal Ck. In this way, it is convenient to respectively count rising edges or falling edges of the plurality of frequency-divided clock signals subsequently, and a sum value of all the counts is determined as a measurement value for number of pulses in the clock signal Ck.

As an example, with continued reference to FIG. 3A, the plurality of frequency-divided clock signals have an equal frequency, which is convenient for reducing design complexity of the plurality of counting circuits for respectively counting the plurality of frequency-divided clock signals subsequently, and thus reducing costs and improving reliability of the circuits.

As an example, with continued reference to FIG. 3A, the pulses of different frequency-divided clock signals are misaligned with each other, such that the number of pulses in the clock signal Ck can be calculated by the adding circuit subsequently according to sum values of the plurality of counting circuits.

As an example, with continued reference to FIG. 3A, the plurality of frequency-divided clock signals include a first divide-by-two clock signal CkA and a second divide-by-two clock signal CkB. The logic subcircuit 12 includes a first AND gate And1, a second AND gate And2, and a first inverter Inv1. A first input terminal of the first AND gate And1 is connected to the clock signal Ck, a second input terminal of the first AND gate And1 is connected to the output terminal of the clock frequency-dividing subcircuit 11, and an output terminal of the first AND gate And1 is configured to output the first divide-by-two clock signal CkA. An input terminal of the first inverter Inv1 is connected to the output terminal of the clock frequency-dividing subcircuit 11, and an output terminal of the first inverter Inv1 is connected to a second input terminal of the second AND gate And2. A first input terminal of the second AND gate And2 is connected to the clock signal Ck, and an output terminal of the second AND gate And2 is configured to output the second divide-by-two clock signal CkB. This embodiment facilitates to respectively count the rising edges or falling edges of the first divide-by-two clock signal CkA and the second divide-by-two clock signal CkB and determine a sum value of the two counts as a measurement value for number of pulses in the clock signal Ck, which can, compared with directly counting number of pulses in the clock signal Ck, effectively reduce the carry operation delay time for the plurality of counting circuits and prevent occurrence of counting errors caused by the carry operation delay time exceeding the count clock period, such that the operating frequency, stability and reliability of the counter are improved.

As an example, with continued reference to FIG. 3A, the clock frequency-dividing subcircuit 11 includes a second inverter Inv2 and a first D flip-flop DFF1. A clock input terminal of the first D flip-flop DFF1 is configured to receive the clock signal Ck, a data input terminal of the first D flip-flop DFF1 is connected to an output terminal of the second inverter Inv2, a data output terminal of the first D flip-flop DFF1 is connected to an input terminal of the second inverter Inv2, and an output terminal of the first D flip-flop DFF1 is configured to output the at least one initial frequency-divided clock signal clk0, to generate the at least one initial frequency-divided clock signal clk0 whose frequency is half of the frequency of the clock signal Ck, such that a plurality of frequency-divided clock signals may be generated by means of the logic subcircuit 12 according to the at least one initial frequency-divided clock signal clk0 and the clock signal Ck.

Figure 3B:
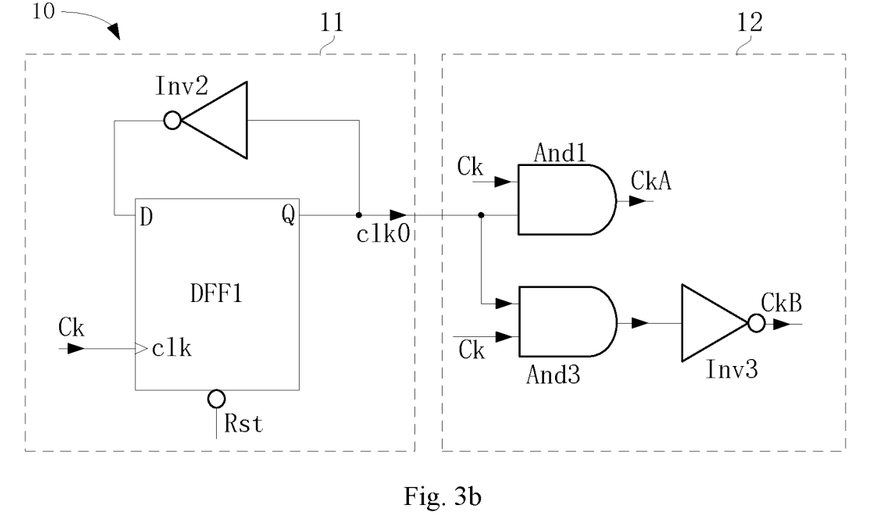

As an example, referring to FIG. 3B, the logic subcircuit 12 includes a first AND gate And1, a third AND gate And3, and a third inverter Inv3. The first input terminal of the first AND gate And1 is connected to the clock signal Ck, the second input terminal of the first AND gate And1 is connected to an output terminal of the clock frequency-dividing subcircuit 11, and the output terminal of the first AND gate And1 is configured to output the first divide-by-two clock signal CkA. A first input terminal of the third AND gate And3 is connected to the output terminal of the clock frequency-dividing subcircuit 11, a second input terminal of the third AND gate And3 is configured to receive the clock signal Ck, an output terminal of the third AND gate And3 is connected to an input terminal of the third inverter Inv3, and an output terminal of the third inverter Inv3 is configured to output the second divided-by-two clock signal CkB. This embodiment facilitates to respectively count the rising edges or falling edges of the first divide-by-two clock signal CkA and the second divide-by-two clock signal CkB and determine a sum value of the two counts as a measurement value for number of pulses in the clock signal Ck, which can, compared with directly counting number of pulses in the clock signal Ck, effectively reduce the carry operation delay time for the plurality of counting circuits and prevent occurrence of counting errors caused by the carry operation delay time exceeding the count clock period, such that the operating frequency, stability and reliability of the counter are improved.

Figure 3C:
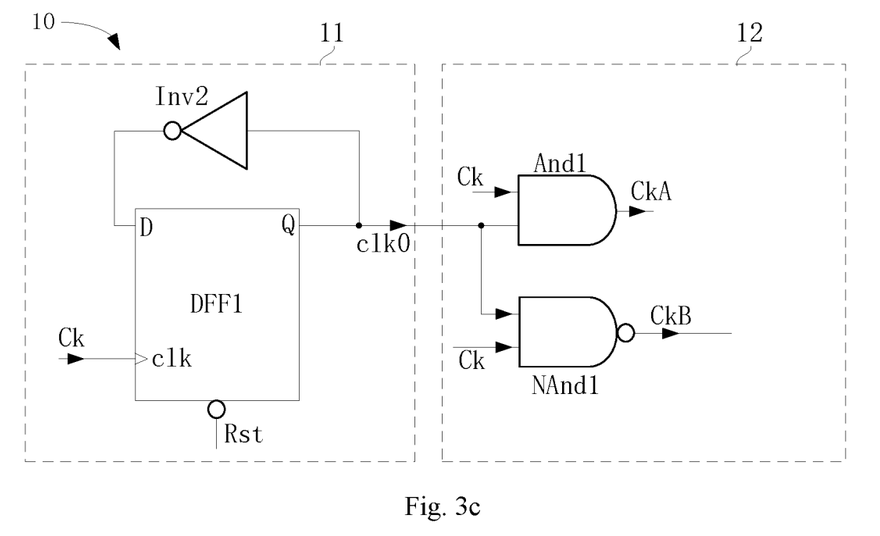

As an example, referring to FIG. 3C, the logic subcircuit 12 includes a first AND gate And1 and a first NAND gate NAnd1. The first input terminal of the first AND gate And1 is connected to the clock signal Ck, the second input terminal of the first AND gate And1 is connected to the output terminal of the clock frequency-dividing subcircuit 11, and the output terminal of the first AND gate And1 is configured to output the first divide-by-two clock signal CkA. A first input terminal of the first NAND gate NAnd1 is connected to the output terminal of the clock frequency-dividing subcircuit 11 and is configured to receive the at least one initial frequency-divided clock signal clk0, a second input terminal of the first NAND gate NAnd1 is configured to receive the clock signal Ck, and an output terminal of the first NAND gate NAnd1 is configured to output the second divided-by-two clock signal CkB. This embodiment facilitates to respectively count the rising edges or falling edges of the first divide-by-two clock signal CkA and the second divide-by-two clock signal CkB and determine a sum value of the two counts as a measurement value for number of pulses in the clock signal Ck, which can, compared with directly counting number of pulses in the clock signal Ck, effectively reduce the carry operation delay time for the plurality of counting circuits and prevent occurrence of counting errors caused by the carry operation delay time exceeding the count clock period, such that the operating frequency, stability and reliability of the counter are improved.

Figure 4A:
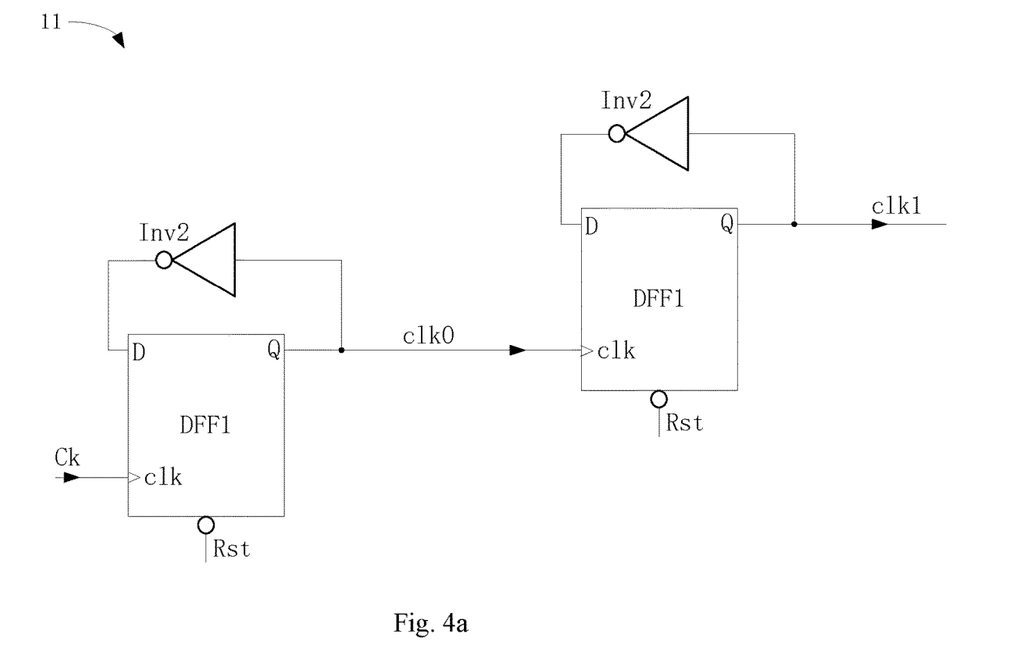
FIGS. 4a-4b are schematic circuit diagrams of clock frequency-dividing subcircuits in the clock counter according to different embodiments of the present disclosure.

As an example, referring to FIG. 4A, the frequency of the clock signal Ck may be divided by the clock frequency-dividing subcircuit 11 to obtain a divide-by-four signal clk1 of the clock signal Ck. For example, the clock frequency-dividing subcircuit 11 is set to include two second inverters Inv2 and two first D flip-flops DFF1. Reset terminals of the two first D flip-flops DFF1 are both connected to a reset signal. A clock input terminal of a first first D flip-flop DFF1 is configured to receive the clock signal Ck, a data input terminal of the first first D flip-flop DFF1 is connected to an output terminal of a first second inverter Inv2, a data output terminal of the first first D flip-flop DFF1 is connected to an input terminal of the first second inverter Inv2, an output terminal of the first first D flip-flop DFF1 is configured to output the at least one initial frequency-divided clock signal clk0 to generate the at least one initial frequency-divided clock signal clk0 whose frequency is half the frequency of the clock signal Ck. A clock input terminal of a second first D flip-flop DFF1 is configured to receive the at least one initial frequency-divided clock signal clk0, a data input terminal of the second first D flip-flop DFF1 is connected to an output terminal of a second second inverter Inv2, a data output terminal of the second first D flip-flop DFF1 is connected to an input terminal of the second second inverter Inv2, and an output terminal of the second first D flip-flop DFF1 is configured to output the divide-by-four signal clk1 of the clock signal Ck, such that two divide-by-four signals whose pulses are misaligned with each other may be generated by means of the logic subcircuit according to the divide-by-four signal clk1 and the clock signal Ck.

Figure 4B:
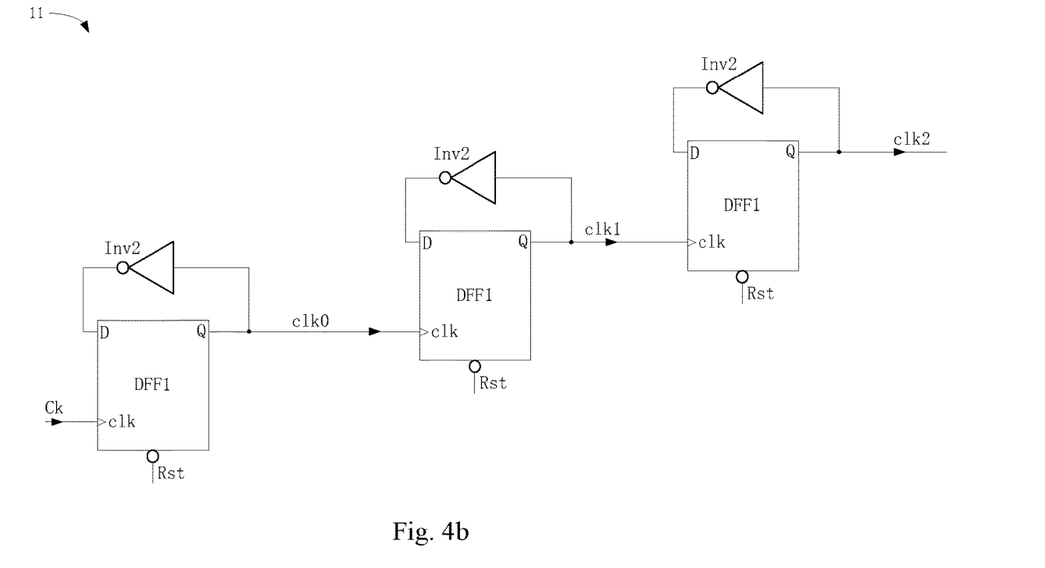

As an example, referring to FIG. 4B, the frequency of the clock signal Ck may be divided by the clock frequency-dividing subcircuit 11 to obtain a divide-by-eight signal clk2 of the clock signal Ck. For example, the clock frequency-dividing subcircuit 11 is set to include three second inverters Inv2 and three first D flip-flops DFF1. Reset terminals of the three first D flip-flops DFF1 are all connected to a reset signal. A clock input terminal of a first first D flip-flop DFF1 is configured to receive the clock signal Ck, a data input terminal of the first first D flip-flop DFF1 is connected to an output terminal of a first second inverter Inv2, a data output terminal of the first first D flip-flop DFF1 is connected to an input terminal of the first second inverter Inv2, an output terminal of the first first D flip-flop DFF1 is configured to output the at least one initial frequency-divided clock signal clk0 to generate the at least one initial frequency-divided clock signal clk0 whose frequency is half the frequency of the clock signal Ck. A clock input terminal of a second first D flip-flop DFF1 is configured to receive the at least one initial frequency-divided clock signal clk0, a data input terminal of the second first D flip-flop DFF1 is connected to an output terminal of a second second inverter Inv2, a data output terminal of the second first D flip-flop DFF1 is connected to an input terminal of the second second inverter Inv2, and an output terminal of the second first D flip-flop DFF1 is configured to output the divide-by-four signal clk1 of the clock signal Ck. A clock input terminal of a third first D flip-flop DFF1 is configured to receive the divide-by-four signal clk1, a data input terminal of the third first D flip-flop DFF1 is connected to an output terminal of a third second inverter Inv2, a data output terminal of the third first D flip-flop DFF1 is connected to an input terminal of the third second inverter Inv2, and an output terminal of the third first D flip-flop DFF1 is configured to output the divide-by-eight signal clk2 of the clock signal Ck, such that two divide-by-eight signals whose pulses are misaligned with each other may be generated by means of the logic subcircuit according to the divide-by-eight signal clk2 and the clock signal Ck.

As an example, each of the plurality of counting circuits includes N second D flip-flops denoted in sequence as a second $D_1$ flip-flop, . . . , a second $D_i$ flip-flop, . . . , and a second $D_N$ flip-flop, and N half adders corresponding to the N second D flip-flops, where the N half adders are denoted in sequence as a first half adder, . . . , an $i^{th}$ half adder, . . . , and an $N^{th}$ half adder, $1 \leq i \leq N$, both i and N being positive integers. The frequency-divided clock signals received by clock input terminals of the second D flip-flops in the same counting circuit are the same, and the frequency-divided clock signals received by the clock input terminals of the second D flip-flops in the different counting circuits are different. An output terminal of the second $D_i$ flip-flop is connected to a second input terminal of the $i^{th}$ half adder, a data input terminal of the second $D_i$ flip-flop is connected to a sum value output terminal of the $i^{th}$ half adder, and a first input terminal of the $i^{th}$ half adder is connected to a carry terminal of the $(i-1)^{th}$ half adder, where a first input terminal of the first half adder is configured to receive a reset signal. Values from the output terminals of the N second D flip-flops constitute one of the initial count values. In this embodiment, it is implemented to respectively count the rising edges or falling edges of the first divide-by-two clock signal CkA and the second divide-by-two clock signal CkB and to determine a sum value of the two counts as a measurement value for number of pulses in the clock signal Ck, which can, compared with directly counting number of pulses in the clock signal Ck, effectively reduce the carry operation delay time for the plurality of counting circuits and prevent occurrence of counting errors caused by the carry operation delay time exceeding the count clock period, such that the operating frequency, stability and reliability of the counter are improved.

Figure 5:
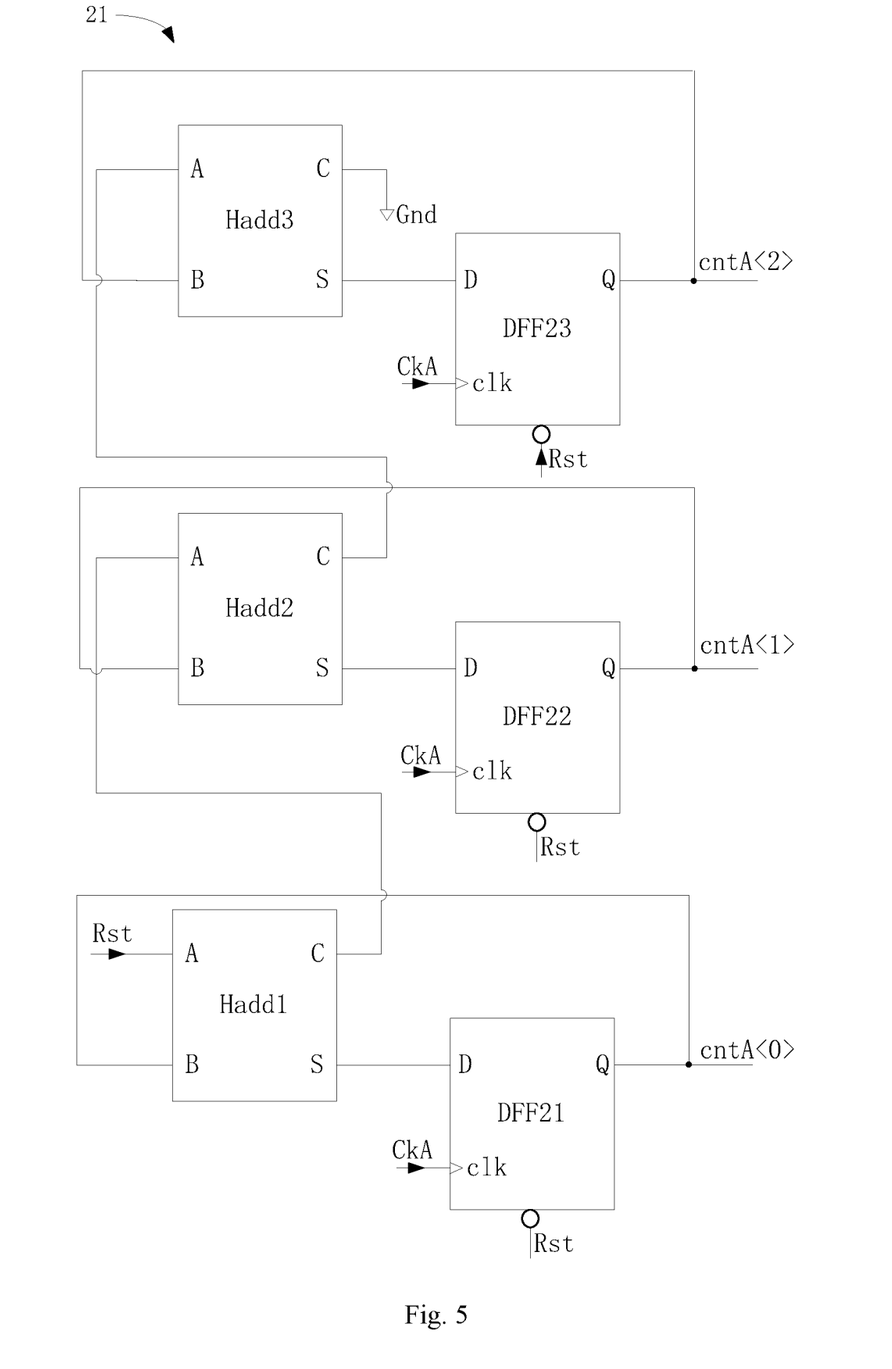
FIG. 5 is a schematic circuit diagram of a first counting circuit in the clock counter according to an embodiment of the present disclosure.

As an example, referring to FIG. 5, the half adder refers to an adder circuit configured to add two input data bits and output one result bit and one carry bit, where the adder circuit has no carry input, and can achieve an add operation of two one-bit binary numbers. A first counting circuit 21 may be set to include three second D flip-flops and three half adders corresponding to the three second D flip-flops. The three second D flip-flops include a second D flip-flop DFF21, a second D flip-flop DFF22, and a second D flip-flop DFF23. The three half adders are denoted in sequence as a first half adder Hadd1, a second half adder Hadd2, and a third half adder Hadd3. Clock input terminals of the second D flip-flop DFF21, second D flip-flop DFF22 and second D flip-flop DFF23 receive the same frequency-divided clock signal, i.e., the first divide-by-two clock signal CkA. Reset terminals of the second D flip-flop DFF21, second D flip-flop DFF22 and second D flip-flop DFF23 all receive a reset signal Rst. An output terminal of the second D flip-flop DFF21 is connected to a second input terminal of the first half adder Hadd1, an output terminal of the second D flip-flop DFF22 is connected to a second input terminal of the second half adder Hadd2, and an output terminal of the second D flip-flop DFF23 is connected to a second input terminal of the third half adder Hadd3. A data input terminal of the second D flip-flop DFF21 is connected to a sum value output terminal of the first half adder Hadd1, a data input terminal of the second D flip-flop DFF22 is connected to a sum value output terminal of the second half adder Hadd2, and a data input terminal of the second D flip-flop DFF23 is connected to a sum value output terminal of the third half adder Hadd3. A first input terminal of the first half adder Hadd1 is configured to receive the reset signal Rst, a first input terminal of the second half adder Hadd2 is connected to a carry terminal of the first half adder Hadd1, a first input terminal of the third half adder Hadd3 is connected to a carry terminal of the second half adder Hadd2, and a carry terminal of the third half adder Hadd3 is grounded. Values from the output terminals of the second D flip-flop DFF21, second D flip-flop DFF22 and second D flip-flop DFF23 constitute one of the plurality of initial count values.

Figure 6:
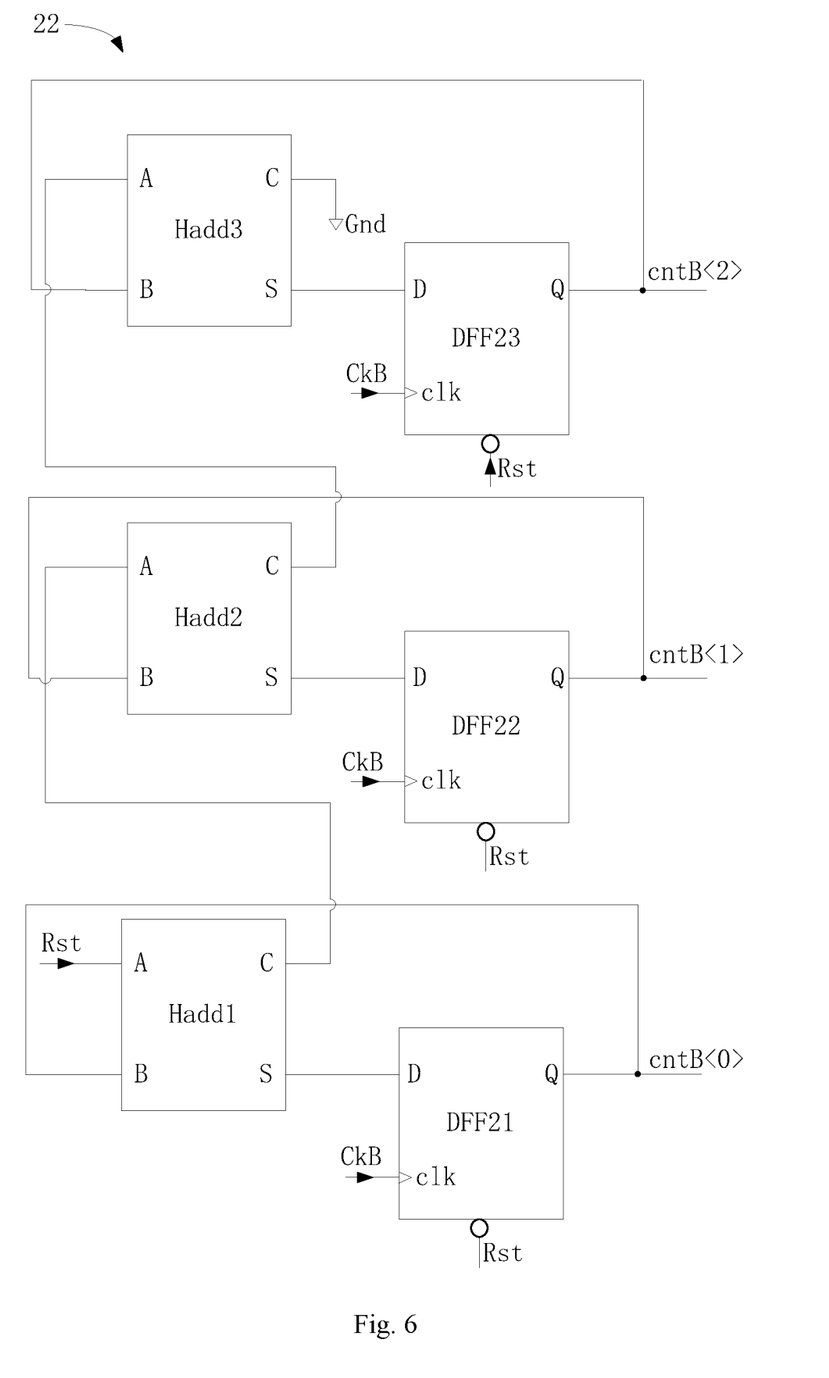
FIG. 6 is a schematic circuit diagram of a second counting circuit in the clock counter according to an embodiment of the present disclosure.

As an example, referring to FIG. 6, a second counting circuit 22 may be set to include three second D flip-flops and three half adders corresponding to the three second D flip-flops. The three second D flip-flops include a second D flip-flop DFF21, a second D flip-flop DFF22, and a second D flip-flop DFF23. The three half adders are denoted in sequence as a first half adder Hadd1, a second half adder Hadd2, and a third half adder Hadd3. Clock input terminals of the second D flip-flop DFF21, second D flip-flop DFF22 and second D flip-flop DFF23 receive the same frequency-divided clock signal, i.e., the second divide-by-two clock signal CkB. Reset terminals of the second D flip-flop DFF21, second D flip-flop DFF22 and second D flip-flop DFF23 all receive the reset signal Rst. An output terminal of the second D flip-flop DFF21 is connected to a second input terminal of the first half adder Hadd1, an output terminal of the second D flip-flop DFF22 is connected to a second input terminal of the second half adder Hadd2, and an output terminal of the second D flip-flop DFF23 is connected to a second input terminal of the third half adder Hadd3. A data input terminal of the second D flip-flop DFF21 is connected to a sum value output terminal of the first half adder Hadd1, a data input terminal of the second D flip-flop DFF22 is connected to a sum value output terminal of the second half adder Hadd2, and a data input terminal of the second D flip-flop DFF23 is connected to a sum value output terminal of the third half adder Hadd3. A first input terminal of the first half adder Hadd1 is configured to receive the reset signal Rst, a first input terminal of the second half adder Hadd2 is connected to a carry terminal of the first half adder Hadd1, a first input terminal of the third half adder Hadd3 is connected to a carry terminal of the second half adder Hadd2, and a carry terminal of the third half adder Hadd3 is grounded. Values from the output terminals of the second D flip-flop DFF21, second D flip-flop DFF22 and second D flip-flop DFF23 constitute one of the plurality of initial count values.

As an example, with continued reference to FIG. 5 and FIG. 6, the rising edges or falling edges of the first divide-by-two clock signal CkA and the second divide-by-two clock signal CkB are respectively counted to determine a sum value of the two counts as a measurement value for number of pulses in the clock signal Ck, which can, compared with directly counting number of pulses in the clock signal Ck, effectively reduce the carry operation delay time for the plurality of counting circuits and prevent occurrence of counting errors caused by the carry operation delay time exceeding the count clock period, such that the operating frequency, stability and reliability of the counter are improved.

As an example, the adding circuit may be set to include a multi-input adder configured to add up the plurality of initial count values of the plurality of counting circuits to generate the target count value to realize intelligent counting of number of pulses in the clock signal, which can, compared with directly counting number of pulses in the clock signal Ck, effectively reduce the carry operation delay time for the plurality of counting circuits and prevent occurrence of counting errors caused by the carry operation delay time exceeding the count clock period, such that the operating frequency, stability and reliability of the counter are improved.

As a combination circuit configured to add up two binary numbers and obtain sum thereof by means of a gate circuit, a full adder is referred to as a one-bit full adder, which can process low-bit carry and output present-bit add carry. A multi-bit full adder may be obtained by cascading a plurality of one-bit full adders. For example, a model of a commonly used binary four-bit full adder may be 74LS283.

As an example, the adding circuit may be set to include $N+1$ full adders denoted in sequence as a first full adder, ..., an $i^{th}$ full adder, ..., and an $(N+1)^{th}$ full adder. A first input terminal of the $i^{th}$ full adder is connected to the output terminal of the second $D_i$ flip-flop in one of the plurality of counting circuits, a second input terminal of the $i^{th}$ full adder is connected to the output terminal of the second $D_i$ flip-flop in another one of the plurality of counting circuits, and an input carry terminal of the $i^{th}$ full adder is connected to an output carry terminal of the $(i-1)^{th}$ full adder. An input carry terminal of the first full adder is grounded, a first input terminal and a second input terminal of the $(N+1)^{th}$ full adder are grounded, and an input carry terminal of the $(N+1)^{th}$ full adder is connected to an output carry terminal of the $N^{th}$ full adder. Values from sum value output terminals of the $N+1$ full adders constitute the target count value, $2 \le i \le N$, both I and N being positive integers. In this embodiment, it is implemented to calculate number of pulses in the clock signal Ck by means of the adding circuit according to sum value of the plurality of counting circuits, which can, compared with directly counting number of pulses in the clock signal Ck, effectively reduce the carry operation delay time for the plurality of counting circuits and prevent occurrence of counting errors caused by the carry operation delay time exceeding the count clock period, such that the operating frequency, stability and reliability of the counter are improved.

Figure 7:
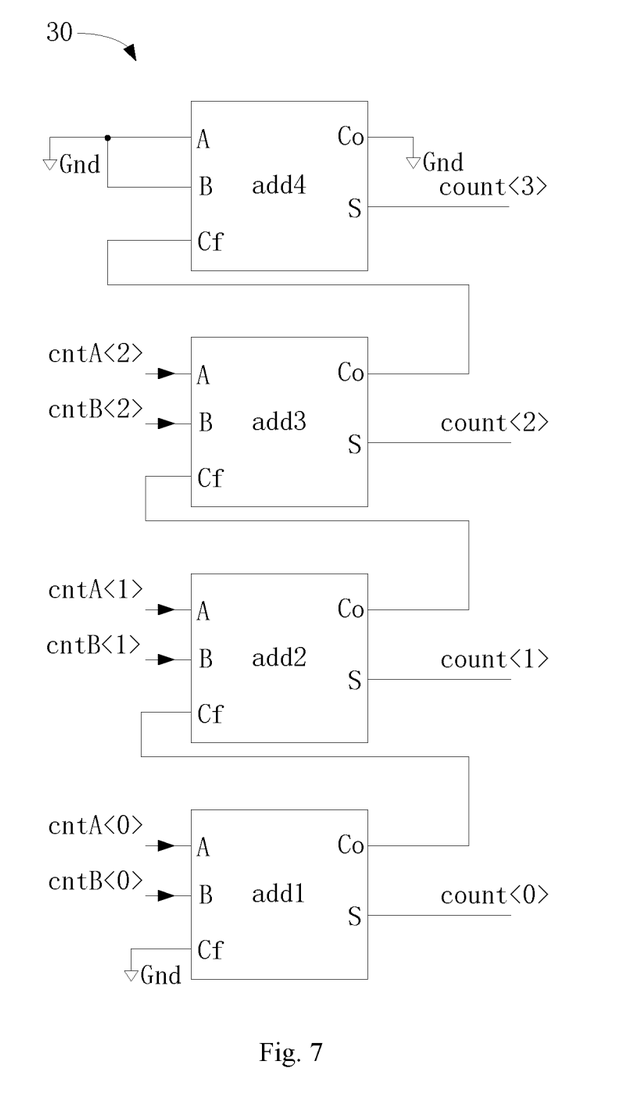
FIG. 7 is a schematic circuit diagram of an adding circuit in the clock counter according to an embodiment of the present disclosure.

As an example, referring to FIG. 7, implementation principles of the embodiments of the present disclosure are exemplarily described by taking an example where the clock counter includes two counting circuits. Those skilled in the art know that different clock frequency-dividing subcircuits are used in the clock frequency-dividing circuit to generate a plurality of frequency-divided clock signals of different frequencies, and in this case, circuit structures of the corresponding counting circuits and adding circuits need to be adaptively changed. Under the inventive concept of the embodiments of the present disclosure, any adaptive changes made should fall within the protection scope of the present disclosure. The adding circuit 30 includes four full adders, which are denoted in sequence as a first full adder add1, a second full adder add2, a third full adder add3, and a fourth full adder add4. A first input terminal of the first full adder add1 is connected to the output terminal of the second D flip-flop DFF21 of the first counting circuit 21, and a second input terminal of the first full adder add1 is connected to the output terminal of the second D flip-flop DFF21 of the second counting circuit 22. A first input terminal of the second full adder add2 is connected to the output terminal of the second D flip-flop DFF22 of the first counting circuit 21, and a second input terminal of the second full adder add2 is connected to the output terminal of the second D flip-flop DFF22 of the second counting circuit 22. A first input terminal of the third full adder add3 is connected to the output terminal of the second D flip-flop DFF23 of the first counting circuit 21, and a second input terminal of the third full adder add3 is connected to the output terminal of the second D flip-flop DFF23 of the second counting circuit 22. A first input terminal and a second input terminal of the fourth full adder add4 are both grounded, and an output carry terminal of the fourth full adder add4 is grounded. An input carry terminal of the fourth full adder add4 is connected to an output carry terminal of the third full adder add3, an input carry terminal of the third full adder add3 is connected to an output carry terminal of the second full adder add2, an input carry terminal of the second full adder add2 is connected to an output carry terminal of the first full adder add1, and an input carry terminal of the first full adder add1 is grounded. Values from sum value output terminals of the first full adder, second full adder add2, third full adder add3 and fourth adder add4 constitute the target count value. In this embodiment, it is implemented to calculate number of pulses in the clock signal Ck by means of the adding circuit 30 according to sum value of two counting circuits, which can, compared with directly counting number of pulses in the clock signal Ck, effectively reduce the carry operation delay time of the counting circuits and prevent occurrence of counting errors caused by the carry operation delay time exceeding the count clock period, such that the operating frequency, stability and reliability of the counter are improved.

As an example, referring to FIG. 8, the first divide-by-two clock signal CkA and the second divide-by-two clock signal CkB have equal frequency, which is convenient for reducing design complexity of the plurality of counting circuits for respectively counting the plurality of frequency-divided clock signals subsequently, and thus reducing costs and improving reliability of the circuits. The frequency of the clock signal Ck is an integral multiple of the frequency of the first divide-by-two clock signal CkA or the frequency of the second divide-by-two clock signal CkB. Pulses of the first divide-by-two clock signal CkA and pulses of the second divide-by-two clock signal CkB are misaligned with each other, such that the number of pulses in the clock signal Ck can be calculated by the adding circuit subsequently according to sum values of the plurality of counting circuits.

Figure 9:
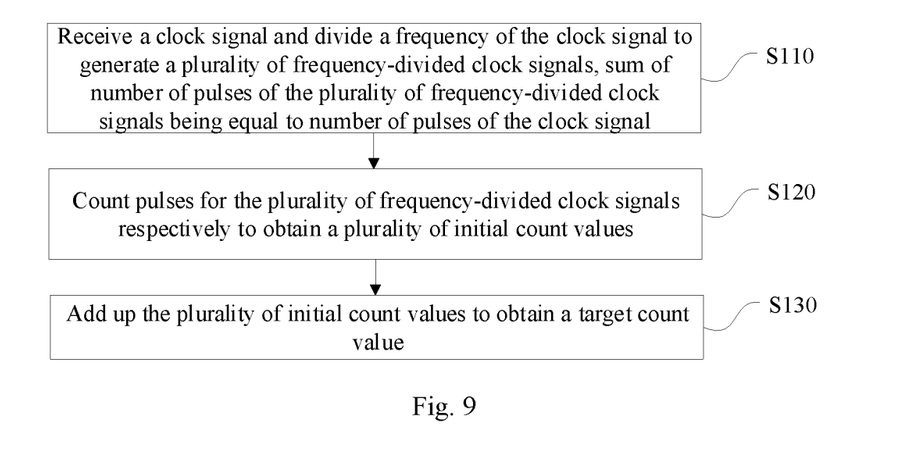
FIG. 9 is a schematic flowchart of a method for clock counting according to an embodiment of the present disclosure.

As an example, referring to FIG. 9, a method for clock counting is provided, including following steps:

Step S110: receiving a clock signal and dividing a frequency of the clock signal to generate a plurality of frequency-divided clock signals, sum of number of pulses of the plurality of frequency-divided clock signals being equal to number of pulses of the clock signal;

Step S120: respectively counting pulses for the plurality of frequency-divided clock signals to obtain a plurality of initial count values; and Step S130: adding up the plurality of initial count values to obtain a target count value.

As an example, with continued reference to FIG. 9, frequencies of clock signals are divided to generate a plurality of frequency-divided clock signals, and then the plurality of frequency-divided clock signals whose frequencies are reduced are separately counted to obtain a plurality of initial count values, which can effectively reduce the carry operation delay time for the plurality of counting circuits compared to directly counting the clock signals. Next, the plurality of initial count values are added up to obtain a target count value to realize intelligent counting of number of pulses in the clock signals, thereby preventing occurrence of counting errors caused by the carry operation delay time exceeding the count clock period. In this way, the operating frequency of the counter is increased, and thus performance and reliability of functional circuits in the clock counter provided by the embodiments of the present disclosure are improved, which is advantageous to increasing an operating speed of a control chip for the clock counter provided by the embodiments of the present disclosure.

Figure 8:
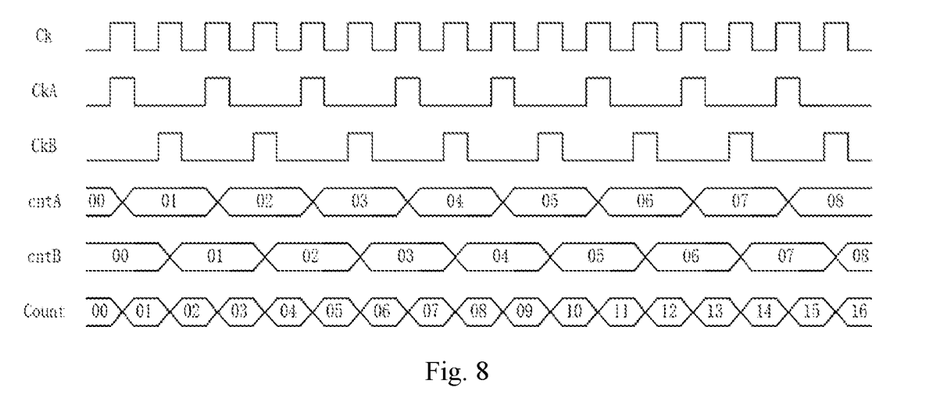
FIG. 8 is a schematic diagram showing an operating time sequence of the clock counter according to an embodiment of the present disclosure.

As an example, with continued reference to FIG. 8 and FIG. 9, the frequency of the clock signal Ck is an integral multiple of the frequencies of the plurality of frequency-divided clock signals. The plurality of frequency-divided clock signals are obtained by dividing the frequency of the clock signal by means of the clock frequency-dividing circuit. Therefore, the clock frequency-dividing circuit may be set as a divide-by-two circuit, a divide-by-three circuit or a divide-by-four circuit and so on based on different application scenarios, and correspondingly, the frequency of the clock signal is divided into a divide-by-two signal, a divide-by-three signal or a divide-by-four and so on, to meet different requirements for the clock frequency in different application scenarios.

As an example, with continued reference to FIG. 8 and FIG. 9, the plurality of frequency-divided clock signals have an equal frequency, which is convenient for reducing design complexity of the plurality of counting circuits for respectively counting the plurality of frequency-divided clock signals subsequently, and thus reducing costs and improving reliability of the circuits.

As an example, with continued reference to FIG. 8 and FIG. 9, the pulses of different frequency-divided clock signals are misaligned with each other, such that the number of pulses in the clock signal can be calculated by the adding circuit subsequently according to sum values of the plurality of counting circuits.

As an example, with continued reference to FIG. 3A, the plurality of frequency-divided clock signals include a first divide-by-two clock signal CkA and a second divide-by-two clock signal CkB. The logic subcircuit 12 includes a first AND gate And1, a second AND gate And2, and a first inverter Inv1. A first input terminal of the first AND gate And1 is connected to the clock signal Ck, a second input terminal of the first AND gate And1 is connected to the output terminal of the clock frequency-dividing subcircuit 11, and an output terminal of the first AND gate And1 is configured to output the first divide-by-two clock signal CkA. An input terminal of the first inverter Inv1 is connected to the output terminal of the clock frequency-dividing subcircuit 11, and an output terminal of the first inverter Inv1 is connected to a second input terminal of the second AND gate And2. A first input terminal of the second AND gate And2 is connected to the clock signal Ck, and an output terminal of the second AND gate And2 is configured to output the second divide-by-two clock signal CkB. This embodiment facilitates to respectively count the rising edges or falling edges of the first divide-by-two clock signal CkA and the second divide-by-two clock signal CkB and determine a sum value of the two counts as a measurement value for number of pulses in the clock signal Ck, which can, compared with directly counting number of pulses in the clock signal Ck, effectively reduce the carry operation delay time for the plurality of counting circuits and prevent occurrence of counting errors caused by the carry operation delay time exceeding the count clock period, such that the operating frequency, stability and reliability of the counter are improved.

As an example, with continued reference to FIG. 3A, the clock frequency-dividing subcircuit 11 includes a second inverter Inv2 and a first D flip-flop DFF1. A clock input terminal of the first D flip-flop DFF1 is configured to receive the clock signal Ck, a data input terminal of the first D flip-flop DFF1 is connected to an output terminal of the second inverter Inv2, a data output terminal of the first D flip-flop DFF1 is connected to an input terminal of the second inverter Inv2, and an output terminal of the first D flip-flop DFF1 is configured to output the at least one initial frequency-divided clock signal clk0, to generate the at least one initial frequency-divided clock signal clk0 whose frequency is half of the frequency of the clock signal Ck, such that a plurality of frequency-divided clock signals may be generated by means of the logic subcircuit 12 according to the at least one initial frequency-divided clock signal clk0 and the clock signal Ck.

As an example, in some embodiments of the present disclosure, there is provided a storage apparatus, which includes the clock counter in any one of the foregoing embodiments of the present disclosure. In this embodiment, a clock frequency-dividing circuit is employed to divide frequencies of clock signals to output a plurality of frequency-divided clock signals. Next, the plurality of frequency-divided clock signals whose frequencies are reduced are separately counted by means of a plurality of counting circuits, which can effectively reduce carry operation delay time for the plurality of counting circuits compared to directly counting the clock signals. Next, a plurality of initial count values outputted from the plurality of counting circuits are added up by means of an adding circuit to generate a target count value, thereby preventing occurrence of counting errors caused by the carry operation delay time exceeding a count clock period. In this way, an operating frequency of the counter is increased, and thus performance and reliability of functional circuits in the clock counter provided by the embodiments of the present disclosure are improved, which is advantageous to increasing an operating speed of a control chip for the clock counter provided by the embodiments of the present disclosure.

Reference may be made to the limitation on the clock counter above for the limitation on the method for clock counting in the foregoing embodiments, detailed description thereof being omitted here.

It is to be understood that although the various steps in the flowchart of FIG. 9 are displayed in sequence as indicated by the arrows, these steps are not necessarily performed in sequence in the order indicated by the arrows. It is to be understood that unless expressly stated herein, the execution of these steps is not strictly limited in sequence, and these steps may be performed in other orders. Moreover, at least a part of the steps in FIG. 9 may include a plurality of steps or a plurality of stages, which are not necessarily performed at the same moment, but may be executed at different moments, and the order of execution of these steps or stages is not necessarily performed sequentially, but may be performed alternately or alternately with at least a part of the steps or stages of other steps or other steps.

Those of ordinary skill in the art may understand that implementation of all or some flows in the method according to the foregoing embodiments may be achieved by instructing relevant hardware by a computer program, wherein the computer program may be stored in a non-transitory computer-readable storage medium, and when the computer program is executed, the flows of the embodiments of the foregoing methods may be included. Any reference to memory, storage, database or other media used in embodiments provided in the embodiments of the present disclosure may include nonvolatile and/or volatile memory. The nonvolatile memory may include a read-only memory (ROM), a programmable ROM (PROM), an electrically programmable read-only memory ROM (EPROM), an electrically erasable programmable ROM (EEPROM) or a flash memory. The volatile memory may include a random access memory (RAM) or an external cache memory. As an illustration and not a limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), synchronization link (Synchlink) DRAM (SLDRAM), Rambus dynamic RAM (RDRAM), direct Rambus dynamic RAM (DRDRAM), and Rambus dynamic RAM (RDRAM), etc.

It is to be noted that the above embodiments are intended for purposes of illustration only and are not intended to limit the present disclosure.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express several implementations of the embodiments of the present disclosure, and descriptions thereof are relatively concrete and detailed. However, these embodiments are not thus construed as limiting the patent scope of the embodiments of the present disclosure. It is to be pointed out that for persons of ordinary skill in the art, some modifications and improvements may be made under the premise of not departing from a conception of the embodiments of the present disclosure, which shall be regarded as falling within the scope of protection of the embodiments of the present disclosure. Thus, patent protection scope of the embodiments of the present disclosure shall be subject to the appended claims.

What is claimed is:

1. A clock counter comprising:
   a clock frequency-dividing circuit configured to receive a clock signal and divide a frequency of the clock signal to output a plurality of frequency-divided clock signals, sum of number of pulses of the plurality of frequency-divided clock signals being equal to number of pulses of the clock signal;
   a plurality of counting circuits connected to the clock frequency-dividing circuit, each of the plurality of counting circuits being configured to respectively count pulses for each of the plurality of frequency-divided clock signals and generate an initial count value; and
   an adding circuit connected to the plurality of counting circuits, the adding circuit being configured to add up the initial count values of the plurality of counting circuits to generate a target count value.

2. The clock counter according to claim 1, wherein the frequency of the clock signal is an integral multiple of frequencies of the plurality of frequency-divided clock signals.

3. The clock counter according to claim 2, wherein the clock frequency-dividing circuit comprises:
   a clock frequency-dividing subcircuit connected to the clock signal, the clock frequency-dividing subcircuit being configured to generate at least one initial frequency-divided clock signal according to the clock signal; and
   a logic subcircuit connected to both an output terminal of the clock frequency-dividing subcircuit and the clock signal, the logic subcircuit being configured to generate the plurality of frequency-divided clock signals according to the at least one initial frequency-divided clock signal and the clock signal.

4. The clock counter according to claim 3, wherein the plurality of frequency-divided clock signals comprise a first divide-by-two clock signal and a second divide-by-two clock signal, the logic subcircuit comprising a first AND gate, a second AND gate, and a first inverter;
   a first input terminal of the first AND gate is connected to the clock signal, a second input terminal of the first AND gate being connected to the output terminal of the clock frequency-dividing subcircuit, and an output terminal of the first AND gate being configured to output the first divide-by-two clock signal;
   an input terminal of the first inverter is connected to the output terminal of the clock frequency-dividing subcircuit, an output terminal of the first inverter being connected to a second input terminal of the second AND gate; and
   a first input terminal of the second AND gate is connected to the clock signal, an output terminal of the second AND gate being configured to output the second divide-by-two clock signal.

5. The clock counter according to claim 3, wherein the clock frequency-dividing subcircuit comprises:
   a second inverter; and
   a first D flip-flop, a clock input terminal of the first D flip-flop being configured to receive the clock signal, a data input terminal of the first D flip-flop being connected to an output terminal of the second inverter, a data output terminal of the first D flip-flop being connected to an input terminal of the second inverter, and an output terminal of the first D flip-flop being configured to output the at least one initial frequency-divided clock signal.

6. The clock counter according to claim 1, wherein the plurality of frequency-divided clock signals have an equal frequency.

7. The clock counter according to claim 1, wherein pulses of some of the plurality of frequency-divided clock signals different are misaligned with each other.

8. The clock counter according to claim 6, wherein each of the plurality of counting circuits comprises:
   N second D flip-flops denoted in sequence as a second $D_1$ flip-flop, ..., a second $D_i$ flip-flop, ..., and a second $D_N$ flip-flop, and N half adders corresponding to the N second D flip-flops, the N half adders being denoted in sequence as a first half adder, ..., an $i^{th}$ half adder, ..., and an $N^{th}$ half adder, $1 \le i \le N$, both i and N being positive integers; the frequency-divided clock signals received by clock input terminals of the second D flip-flops in the same counting circuit being the same, and the frequency-divided clock signals received by the clock input terminals of the second D flip-flops in the different counting circuits being different;
   an output terminal of the second $D_i$ flip-flop is connected to a second input terminal of the $i^{th}$ half adder, a data input terminal of the second $D_i$ flip-flop being connected to a sum value output terminal of the $i^{th}$ half adder, a first input terminal of the $i^{th}$ half adder being connected to a carry terminal of the $(i-1)^{th}$ half adder, and a first input terminal of the first half adder being configured to receive a reset signal; and
   values from the output terminals of the N second D flip-flops constitute one of the initial count values.

9. The clock counter according to claim 7, wherein the adding circuit comprises a multi-input adder configured to add up the initial count values of the plurality of counting circuits to generate the target count value.

10. The clock counter according to claim 8, wherein the clock counter comprises two of the plurality of counting circuits, the adding circuit comprising N+1 full adders denoted in sequence as a first full adder, ..., an $i^{th}$ full adder, ..., and an $(N+1)^{th}$ full adder;
   a first input terminal of the $i^{th}$ full adder is connected to the output terminal of the second $D_i$ flip-flop in one of the plurality of counting circuits, a second input terminal of the $i^{th}$ full adder being connected to the output terminal of the second $D_i$ flip-flop in another one of the plurality of counting circuits, an input carry terminal of the $i^{th}$ full adder being connected to an output carry terminal of the $(i-1)^{th}$ full adder, an input carry terminal of the first full adder being grounded, a first input terminal and a second input terminal of the $(N+1)^{th}$ full adder being grounded, and an input carry terminal of the $(N+1)^{th}$ full adder being connected to an output carry terminal of the $N^{th}$ full adder; and
   values from sum value output terminals of the N+1 full adders constitute the target count value, $2 \le i \le N$.

11. A method for clock counting comprising:
   receiving a clock signal, by a clock frequency-dividing circuit, and dividing a frequency of the clock signal to generate a plurality of frequency-divided clock signals, sum of number of pulses of the plurality of frequency-divided clock signals being equal to number of pulses of the clock signal;
   respectively counting pulses, by a plurality of counting circuits, for the plurality of frequency-divided clock signals to obtain a plurality of initial count values; and
   adding up, by an adding circuit, the plurality of initial count values to obtain a target count value.

12. The method for clock counting according to claim 11, wherein the frequency of the clock signal is an integral multiple of frequencies of the plurality of frequency-divided clock signals, the frequencies of the plurality of frequency-divided clock signals being equal.

13. The method for clock counting according to claim 11, wherein pulses of some of the plurality of frequency-divided clock signals different are misaligned with each other.

14. The method for clock counting according to claim 11, wherein number of the plurality of frequency-divided clock signals is two.

15. A storage apparatus comprising a clock counter, wherein the clock counter comprises:
   a clock frequency-dividing circuit configured to receive a clock signal and divide a frequency of the clock signal to output a plurality of frequency-divided clock signals, sum of number of pulses of the plurality of frequency-divided clock signals being equal to number of pulses of the clock signal;
   a plurality of counting circuits connected to the clock frequency-dividing circuit, each of the plurality of counting circuits being configured to respectively count pulses for each of the plurality of frequency-divided clock signals and generate an initial count value; and
   an adding circuit connected to the plurality of counting circuits, the adding circuit being configured to add up the initial count values of the plurality of counting circuits to generate a target count value.

\* \* \* \* \*